US005942734A

United States Patent [19]

Calvert et al.

[11] Patent Number: 5,942,734

[45] Date of Patent: Aug. 24, 1999

[54] NOISE-ATTENUATING SHIELDING UNIT AND METHOD FOR LOUDSPEAKERS

[75] Inventors: Steven Wade Calvert, Pflugerville; Reynold Li Liao, Austin, both of Tex.

[73] Assignee: Dresser Industries, Inc., Dallas, Tex.

[21] Appl. No.: 09/129,929

[22] Filed: Aug. 6, 1998

[51] Int. Cl.$^{6}$ .......... H05K 5/00

[52] U.S. Cl. .......... 181/151; 181/199

[58] Field of Search .......... 181/146, 151, 181/166, 199; 381/189

[56] References Cited

U.S. PATENT DOCUMENTS

| | | | |
|---|---|---|---|
| 3,592,290 | 7/1971 | Armstrong . | |
| 4,127,751 | 11/1978 | Kinoshita | 181/151 |
| 4,439,644 | 3/1984 | Bruney, III . | |
| 4,506,759 | 3/1985 | Fatovic | 181/151 |
| 5,570,429 | 10/1996 | Paddock . | |
| 5,629,503 | 5/1997 | Thomasen . | |

*Primary Examiner*—Khanh Dang

*Attorney, Agent, or Firm*—Haynes & Boone, L.L.P.

[57] ABSTRACT

A noise-attenuating shielding unit and method for a speaker according to which a shield is formed by a housing of a noise-attenuating material having a metal plate attached thereto. The housing is located over at least a portion of the speaker and relative to the speaker so that the plate is magnetically attracted to the magnet of the speaker to secure the shielding unit to the speaker.

6 Claims, 1 Drawing Sheet

NOISE-ATTENUATING SHIELDING UNIT AND METHOD FOR LOUDSPEAKERS

BACKGROUND OF THE INVENTION

The present invention relates to a shielding unit and method for a loudspeaker, and, more particularly, to a shielding unit and method for preventing the transmission of ambient noise through a loudspeaker.

SUMMARY OF THE INVENTION

Loudspeakers of many types, sizes, and configurations are provided for reproducing sound. By far the most common loudspeaker is a cone loudspeaker that vibrates in response to an input signal to produce sound waves that represent an analog of the applied signal voltage. In order to obtain the best quality sound reproduction, one or more of these type speakers, or drivers, are usually mounted in a specifically designed cabinet, usually of wood. The cabinet is especially designed for the particular speaker or speakers and often includes a damping material, reinforcing structure, and crossover networks. However, these systems are relative expensive and take up a relatively large amount of space.

Therefore, there are many applications, such as intercoms, public address systems, and the like, in which a speaker is mounted at aparticular site in its "raw" form, that is, without being placed in a cabinet. Although this reduces costs and conserves space, it can lead to other problems. For example, if is often desirable to place a raw, unenclosed speaker in a unit, such as a gasoline dispensing unit, or the like, to reproduce program material, in the form of music, voice messages, commercials, etc., for reproduction for the customer (user) of the dispensing unit in an area immediately adjacent the latter unit. However, these dispensing units, as well as similar type units contain components, such as fans and pumps, that generate noise, and since the speaker is usually placed in an opening in the cabinet of the unit, this noise will be transmitted through the speaker, the opening, and to an area immediately adjacent the unit. Therefore, when an audio input is reproduced by the speaker, it is difficult to hear the reproduced information due to the transmitted noise.

Therefore, what is needed is a speaker that can be utilized in its raw form without the need of a specially designed cabinet, yet can perform in a noisy environment without transmitting the noise.

SUMMARY OF THE INVENTION

The present invention, accordingly, is directed to a shielding unit formed by a housing of a noise-attenuating material having a metal plate attached thereto. The housing is located over at least a portion of the speaker and is positioned so that the plate is magnetically attracted to the magnet of the speaker to secure the shielding unit to the speaker. This achieves a major advantage since the shielding unit prevents the transmission of ambient noise thought the speaker.

DESCRIPTION OF THE PREFERRED EMBODIMENT

Figure 1:
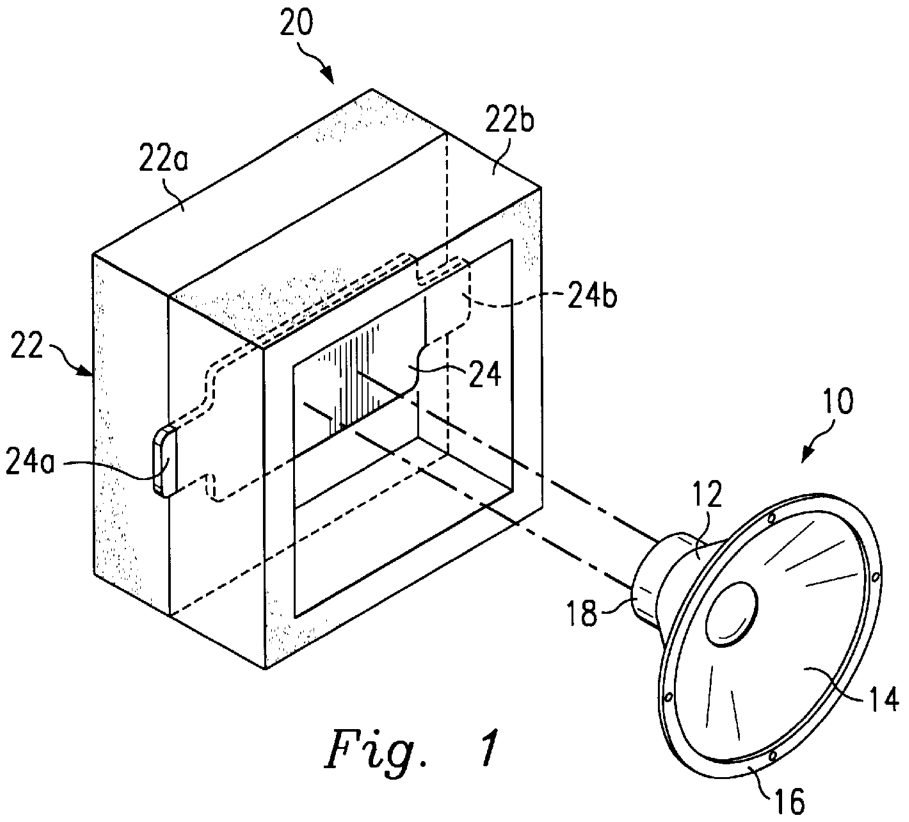
FIG. 1 is an exploded isometric view of the speaker and shielding unit of the present invention.

Referring to FIG. 1 of the drawings, the reference numeral 10 refers, in general, to a speaker which includes a rigid body member 12, a semi-rigid cone 14 attached to the body member by an annular surround 16, and a magnet assembly 18 mounted to the rear of the body member 12. Although not shown in the drawings, it is understood that the magnet assembly 18 includes a pole piece and a toroidal-shaped magnet, and that a cylindrical coil of wire, usually called a "voice-coil", is connected to the cone and is physically suspended around, and movable relative to, the magnet assembly. Thus, when a signal voltage is connected across the terminals of the coil, an electrical current flows through the coil which produces a magnetic field surrounding the coil that causes the coil to be alternately attracted to, and repulsed by, the magnetic flux from the magnet assembly 18. This alternating attraction and repulsion causes the coil, and therefore the cone, to move in a reciprocal manner such that sound waves are produced that represent an analog of the signal voltage applied across the coil. Since the speaker 10, as well as the above components, are conventional, they will not be described in any further detail.

Figure 2:
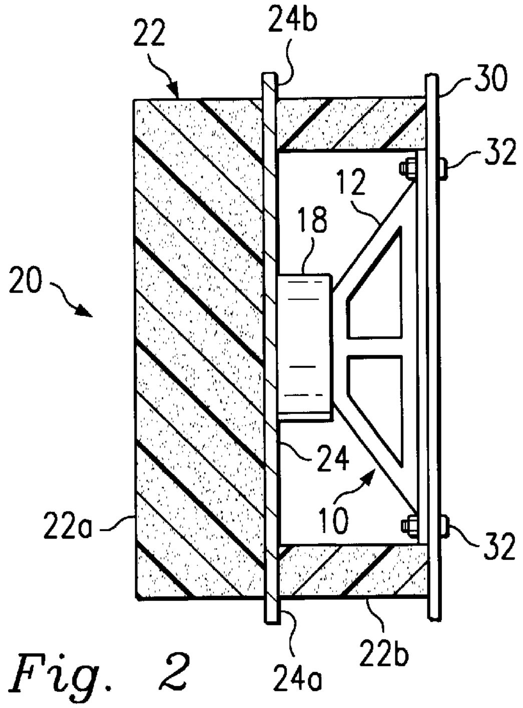
FIG. 2 is a sectional view of the speaker and shielding unit of the of the present invention.

A shielding unit is referred to, in general, by the reference numeral 20 and includes a rectangular-shaped housing 22 having one open end and fabricated of a sound-attenuating material, such as foam rubber or plastic. As shown in FIG. 2 the housing is formed by a solid piece 22*a* and a hollow, rectangular piece 22*b* attached to the solid piece by adhesive, or the like.

A metal plate 24 extends over a portion of the inner surface of the bottom wall of the housing 22 and has two tabs 24*a* and 24*b*, that extend through, and project from, the respective side walls of the housing, and preferable through the junction between the housing pieces 22*a* and 22*b*. Although the tabs 24*a* and 24*b* function to secure the plate 24 to the housing 22, the plate can be further secured to the housing by placing adhesive, or the like, between their respective abutting surfaces.

The shielding unit 20 is shown slightly separated from the speaker 10 in FIG. 1 and attached to the speaker in FIG. 2. In the latter position, the metal plate 24 is magnetically attracted to the magnet assembly 18 of the speaker 10 to hold the plate, and therefore the housing 22, to the speaker. This permits a quick and secure attachment of the shielding unit 20 to the speaker 10 yet permits the shielding unit to be quickly removed from the speaker by simply engaging the tabs 24*a* and 24*b* of the plate 24 and pulling the shielding unit away from the speaker.

For the purposes of example, the speaker 10 is shown in FIG. 2 mounted in the interior of a self-service gasoline dispensing unit at a service station, with a wall of the dispensing unit being shown partially and referred to by the reference numeral 30. The speaker 10 is attached to the wall 30 so as to extend flush with an opening (not shown) in the wall and is attached to the wall by a plurality of angularly-spaced nut-bolt assemblies 32. In this environment, an audio signal is transmitted, via an appropriate electrical conductor, to the aforementioned voice coil of the speaker 10 in the form of music, voice messages, commercials, etc. for reproduction for the customer (user) of the dispensing unit in an area immediately adjacent the latter unit.

However, as discussed above, the interior of such a dispensing unit often contains fans, pumps, etc. which generate relatively high levels of noise that is normally transmitted through the speaker 10 and the opening in the wall 30. Thus, this noise severely compromises the ability of the customer to hear the reproduced sound with any clarity.

However, according to the present invention, the speaker 10 can be installed to the wall 30 in a normal manner as shown in FIG. 2, and the housing 22 is positioned relative to the speaker and is advanced towards the speaker so that the plate 24 is magnetically attracted to the magnet 18 to secure the housing over the speaker in the position shown. The shielding unit 20 considerably attenuates a substantial portion of the noise generated by the components in the interior of the housing of the gasoline dispensing unit, thus providing a relatively quiet environment for the user (customer) of the dispensing unit.

The present invention thus enjoys several advantages. For example, the shielding unit 20 prevents the transmission of ambient noise thought the speaker 10 thus establishing a relative quiet environment at the location of the customer immediately adjacent the gasoline dispensing unit.

It is understood that variations may be made in the foregoing without departing from the scope of the present invention. For example, the present invention is not limited to the specific design of the speaker 10, as described above, as long as the speaker contains a magnet for attracting the metal plate 24 of the shielding unit 20. Also, the shielding unit 20 can be fabricated of a sound-attenuating material other than foam rubber or plastic, can be fabricated in one piece, and is not limited to the specific shape and relative dimensions described above. Further, the location of the speaker 10 is not limited to the interior of a gas dispensing unit, but can be disposed in any self-contained noisy environment.

It is understood that other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. In combination, a speaker for reproducing an audio input signal and comprising a magnet; and a shielding unit extending over at least a portion of the speaker, the shielding unit comprising a housing fabricated from a sound attenuating material, and a metal plate attached to the housing and magnetically attracted to the magnet to secure the shielding unit to the speaker.

2. The combination of claim 1 wherein the housing comprises a hollow enclosure having one open end for receiving the speaker.

3. The combination of claim 2 wherein the plate is mounted in housing in a manner to contact the magnet when the housing is placed over the speaker.

4. The combination of claim 1 wherein the plate has at least one tab extending through a wall of the housing to secure the plate to the housing and to permit quick removal of the plate from the housing.

5. The combination of claim 1 wherein the speaker further comprises a body member attached to the magnet and a cone attached to the body member.

6. A method of shielding a speaker comprising the steps of providing a housing of a noise-attenuating material having a metal plate attached thereto, and locating the housing relative to the speaker so that the housing covers at least a portion of the speaker and so that the plate is magnetically attracted to the magnet of the speaker to secure the housing to the speaker.

* * * * *